US011119051B2

(12) United States Patent
Egan et al.

(10) Patent No.: US 11,119,051 B2
(45) Date of Patent: *Sep. 14, 2021

(54) PARTICLE DETECTION FOR SUBSTRATE PROCESSING

(71) Applicant: Applied Materials, Inc., Santa Clara, CA (US)

(72) Inventors: Todd Egan, Fremont, CA (US); Mehdi Vaez-Iravani, Los Gatos, CA (US); Samer Banna, San Jose, CA (US); Kyle Tantiwong, Livermore, CA (US); Gregory Kirk, Pleasanton, CA (US); Abraham Ravid, San Jose, CA (US); Yaoming Shen, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/062,231

(22) Filed: Oct. 2, 2020

(65) Prior Publication Data

US 2021/0018449 A1    Jan. 21, 2021

Related U.S. Application Data

(63) Continuation of application No. 16/080,075, filed as application No. PCT/US2017/034028 on May 23, 2017, now Pat. No. 10,845,317.

(Continued)

(51) Int. Cl.
*G01N 21/00* (2006.01)
*G01N 21/95* (2006.01)
(Continued)

(52) U.S. Cl.
CPC ..... *G01N 21/9501* (2013.01); *G01N 15/0211* (2013.01); *G01N 15/1425* (2013.01);
(Continued)

(58) Field of Classification Search
CPC .. G01N 21/9501; G01N 21/94; G01N 21/956; G01N 21/95607; G01N 21/8806
(Continued)

(56) References Cited

U.S. PATENT DOCUMENTS 5,467,189 A    11/1995   Kreikebaum et al.
6,305,097 B1   10/2001   Salamati-Saradh et al.
(Continued)

FOREIGN PATENT DOCUMENTS

WO    2014206747 A1    12/2014

OTHER PUBLICATIONS

International Search Report and Written Opinion dated Aug. 30, 2017 for International Application No. PCT/US2017/034028.

*Primary Examiner* — Md M Rahman
(74) *Attorney, Agent, or Firm* — Patterson + Sheridan, LLP

(57) ABSTRACT

A system for processing a substrate is provided. The system includes a process chamber including one or more sidewalls enclosing a processing region; and a substrate support. The system further includes a passageway connected to the process chamber; and a first particle detector disposed at a first location along the passageway. The first particle detector includes an energy source configured to emit a first beam; one or more optical devices configured to direct the first beam along one or more paths, where the one or more paths extend through at least a portion of the passageway. The first particle detector further includes a first energy detector disposed at a location other than on the one or more paths. The system further includes a controller configured to communicate with the first particle detector, wherein the controller is configured to identify a fault based on signals received from the first particle detector.

20 Claims, 5 Drawing Sheets

Related U.S. Application Data

(60) Provisional application No. 62/340,301, filed on May 23, 2016.

(51) Int. Cl.
  *H01L 21/67* (2006.01)
  *G01N 15/02* (2006.01)
  *G01N 15/14* (2006.01)
  *G01N 21/94* (2006.01)

(52) U.S. Cl.
  CPC ....... *G01N 21/94* (2013.01); *H01L 21/67253* (2013.01); *H01L 21/67288* (2013.01); *G01N 2015/1486* (2013.01)

(58) Field of Classification Search
  USPC ...................................................... 356/237.4
  See application file for complete search history.

(56) References Cited

U.S. PATENT DOCUMENTS

| | | |
|---|---|---|
| 6,395,102 B1 | 5/2002 | Salamati-Saradh et al. |
| 6,545,272 B1 | 4/2003 | Kondo |
| 6,707,544 B1 | 3/2004 | Hunter et al. |
| 6,833,918 B2 | 12/2004 | Kurozumi et al. |
| 7,852,476 B2 | 12/2010 | Moriya et al. |
| 7,969,572 B2 | 6/2011 | Moriya et al. |
| 2002/0094685 A1 | 7/2002 | Nakata et al. |
| 2011/0216322 A1 | 9/2011 | Moriya et al. |

PARTICLE DETECTION FOR SUBSTRATE PROCESSING

CROSS-REFERENCE TO RELATED APPLICATIONS

This application is a continuation application of co-pending U.S. patent application Ser. No. 16/080,075 filed Aug. 27, 2018, which is a 371 U.S. National Stage of International Application No. PCT/US2017/034028, filed May 23, 2017, which claims priority to U.S. Provisional Patent Application No. 62/340,301, filed May 23, 2016, the disclosures of which are all herein incorporated by reference in their entirety.

BACKGROUND

Field

Embodiments of the disclosure generally relate to a method and apparatus for detecting particles during the processing of substrates.

Description of the Related Art

Numerous processes can be performed on substrates (e.g., semiconductor substrates) in process chambers, such as deposition processes, implantation processes, lithography steps, and more. As each additional substrate is processed in a given process chamber, particles can begin to accumulate inside of the chamber. Particle accumulation inside of the process chamber eventually leads to particles landing on the surface of the substrate being processed. If large enough particles land on the surface of a substrate, then the particles can damage the electronic components or circuitry on the substrate, which can cause device failure and lower product yield. To prevent particles from causing such problems during the processing of substrates, one substrate out of a given sample size (e.g., 100 substrates) is often tested in a particle analyzer. Although particle analyzers can detect when there are too many particles of a particular size on a given substrate, only one substrate out of the given sample size is tested. Consequently, by the time a substrate having too many particles on its surface is detected, there have often been a number of other substrates previously processed that are likely to have the same problem. In these situations, a number of processed substrates and/or devices formed on the substrates can be damaged by the particle contamination. On the other hand, it is too time consuming and costly to individually test every processed substrate.

Thus, there is a need for an improved system and method for processing substrates in a cost-effective manner that can prevent the waste caused by particle accumulation inside process chambers and that overcomes the problems described above.

SUMMARY

Embodiments of the disclosure generally relate to particle detection for the processing of substrates. In one embodiment, a system for processing a substrate is provided. The system includes a process chamber including one or more sidewalls enclosing a processing region, and a substrate support. The system further includes a first passageway connected to the process chamber, and a first particle detector disposed at a first location along the first passageway. The first particle detector includes an energy source configured to emit a first beam, one or more optical devices configured to direct the first beam along one or more paths, where the one or more paths extend through at least a portion of the first passageway. The first particle detector further includes a first energy detector disposed at a location other than on the one or more paths. The system further includes a controller configured to communicate with the first particle detector, wherein the controller is configured to identify a fault based on signals received from the first particle detector.

In another embodiment, a method of monitoring a system for processing substrates in a process chamber is provided. The method includes placing a substrate in the process chamber, exhausting gas from the process chamber or supplying gas to the process chamber through a first passageway, transmitting a first beam along a first path across a first region of the first passageway, detecting a first plurality of pulses of energy from the first beam at a first energy detector, where the first energy detector is disposed at a location other than on the first path, and identifying a fault based on the detected first plurality of pulses.

In another embodiment, a system for processing a substrate is provided. The system includes a process chamber including one or more sidewalls enclosing an interior region, a substrate support, and a first particle detector disposed in the process chamber. The first particle detector includes: an energy source configured to emit a first beam, a beam dump, one or more optical devices configured to direct the first beam along one or more paths, where the one or more paths begin at the energy source and end at the beam dump. The first particle detector further includes a first energy detector disposed at a location other than on the one or more paths. The system further includes a controller configured to communicate with the first particle detector, where the controller is configured to identify a fault based on signals received from the first particle detector.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the disclosure generally relate to methods and an apparatus for detecting particles during the processing of substrates. The particle detection described herein is performed while a substrate is processed in a process chamber by monitoring the gases to which the substrate is exposed, such as process gas supplied to a processing region, or interior region 104, of a process chamber and exhaust removed from the processing region of the process chamber.

Figure 1:
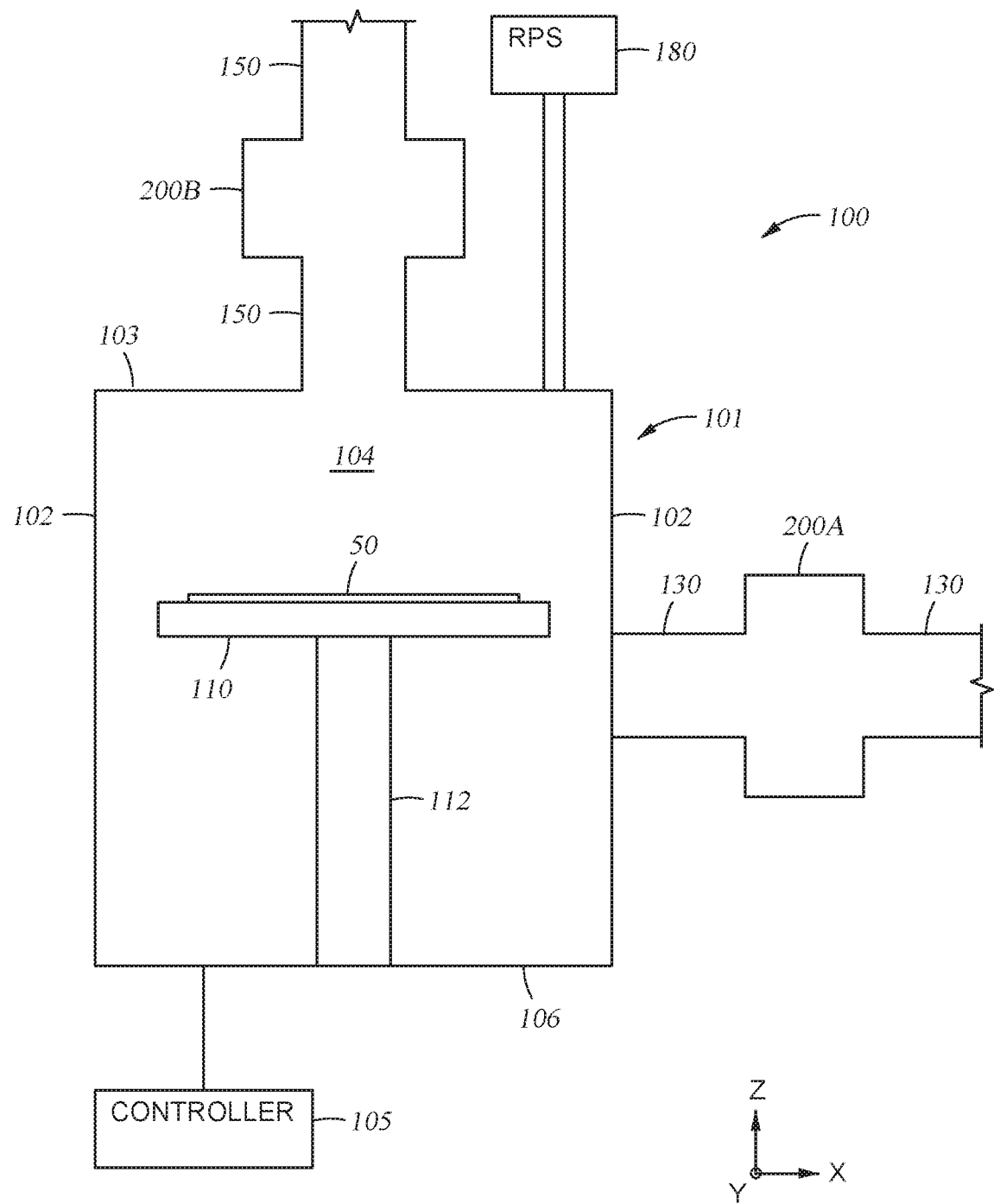
FIG. 1 is a side view of a system for processing a substrate, according to one embodiment.

FIG. 1 is a side view of a system 100 for processing a substrate 50, according to one embodiment. The system 100 includes a process chamber 101. The process chamber 101 includes one or more sidewalls 102, a top 103, and a bottom 106 enclosing an interior region 104. The process chamber 101 further includes a substrate support 110 supported by a shaft 112. The substrate 50 can be placed on the substrate support 110 before processing. Although a simplified chamber is shown, the process chamber 101 could be adapted to perform any number of processes commonly used in the semiconductor industry, such as depositions, etching processes, ion implantations, and lithography steps.

The system 100 can further include an exhaust passageway 130 connected to the process chamber 101. The exhaust passageway 130 can be used to exhaust gases and airborne particles from the interior region 104. The exhaust passageway 130 can also be used to create a vacuum environment in the interior region 104 of the process chamber 101. The system 100 can further include an inlet passageway 150 connected to the process chamber 101. The inlet passageway 150 can be used supply process gases to the interior region 104 of the process chamber 101, such as process gases used to deposit a layer onto the substrate 50.

The system 100 can further include an exhaust particle detector 200A disposed at a location along the exhaust passageway 130. Similarly, the system 100 can further include an inlet particle detector 200B disposed at a location along the inlet passageway 150. The particle detectors 200A, 200B can each be used to detect particles during processing in the process chamber 101. The particle detectors 200A, 200B can detect particles using laser scattering techniques as described below in reference to FIGS. 2 and 3. Placing the particle detectors 200A, 200B in-line with the inlet gas and exhaust gas flows allows for real-time monitoring of particle counts during use of the process chamber 101. This real-time monitoring can increase product quality and improve efficiency. For example, product quality can be improved because the inlet and exhaust can be monitored during the processing of every substrate, which can prevent the processing of substrates that will not meet quality control standards. The efficiency can improved because cleaning procedures can be performed prior to when particle levels cause device yield problems or when needed as opposed to using an estimated chamber maintenance schedule. Furthermore, the particle detectors 200A, 200B can be used to determine when a cleaning procedure is finished by indicating that particle levels have dropped to a level that indicates that the process chamber 101 is clean.

The system 100 can further include a controller 105 configured to communicate with the particle detectors 200A, 200B. The controller 105 can be configured to identify conditions, such as a fault, based on signals received from the particle detectors 200A, 200B. For example, in one embodiment, the controller 105 can identify that particle rates detected by one or more of the particle detectors 200A, 200B exceed a threshold. After the substrate being processed is removed from the process chamber 101, the controller 105 can initiate a sequence to be performed for cleaning the process chamber 101. In one embodiment, the system 100 includes a remote plasma source (RPS) 180 that the controller 105 can initiate to clean the process chamber 101 when one or more of the particle detectors 200A, 200B indicate that at least a portion of the process chamber 101 and/or supporting components needs to be cleaned.

The controller 105 generally includes a central processing unit (CPU), a memory, and support circuits. The CPU may be one of any form of a general purpose computer processor that can be used in an industrial setting. The support circuits are conventionally coupled to the CPU and may comprise cache, clock circuits, input/output subsystems, power supplies, and the like. Software routines loaded in the memory transform the CPU into a specific purpose computer (controller). The memory can include non-transitory memory that can host an application, which, when executed by the CPU, can instruct the components of the system 100 to perform the methods described herein, such as the method 400 described below in reference to FIG. 4. Furthermore, references to the controller 105 provided herein include instances when one or more physical processors are performing part of the computing, such as a processor located within one of the particle detectors and a centralized controller for the system 100. Thus, the controller 105 can refer a centralized controller used to control the system 100 and/or to any processor used in controlling and monitoring the system 100.

Figure 2:
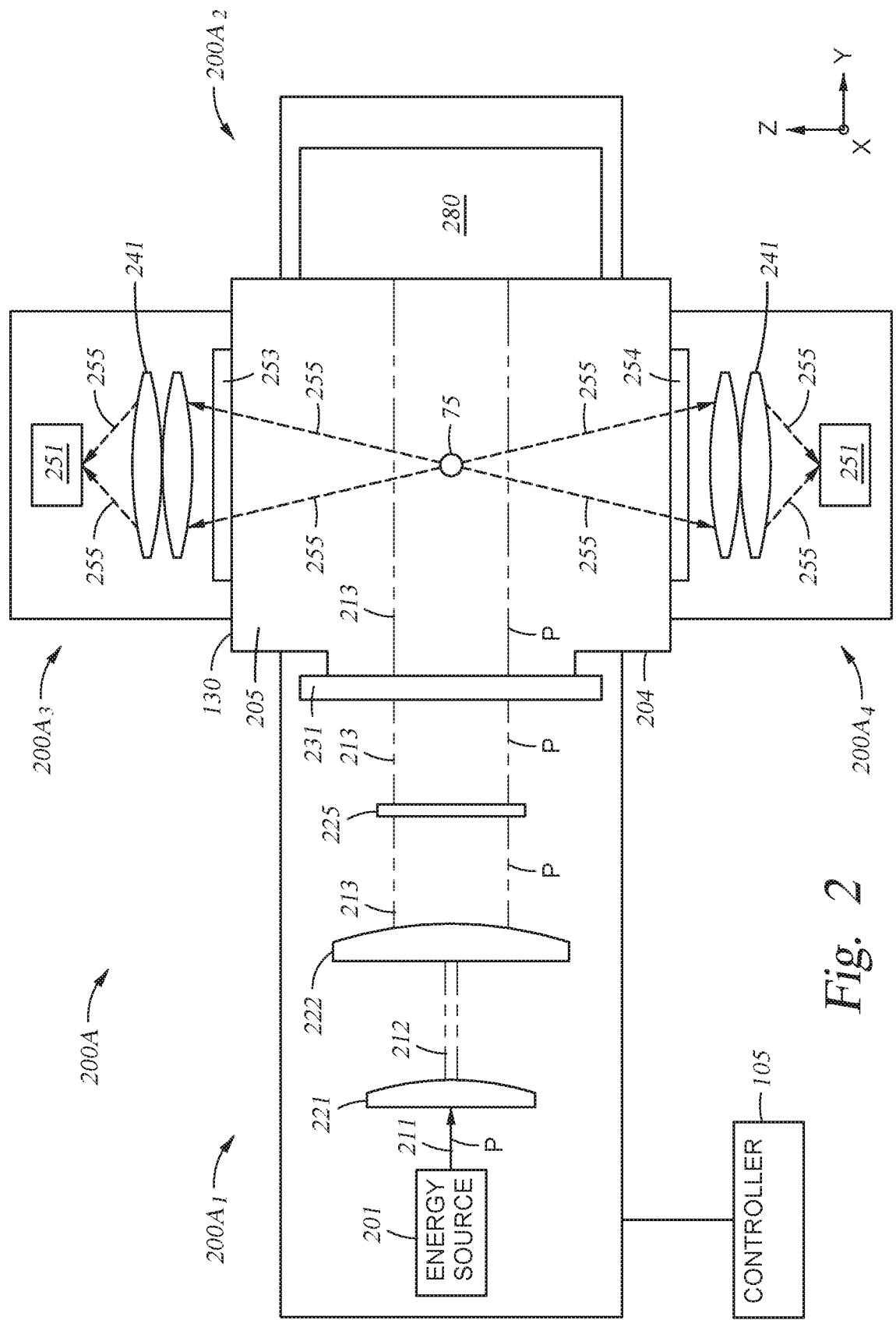
FIG. 2 is a side sectional view of a particle detector disposed around an exhaust passageway, according to one embodiment.

FIG. 2 is a side sectional view of the particle detector 200A, according to one embodiment. Although FIG. 2 is described in reference to the exhaust passageway 130 and the exhaust particle detector 200A, the description is similarly applicable to the inlet passageway 150 and the inlet particle detector 200B.

The exhaust particle detector 200A can include a central portion 204 housing an interior region 205 that forms a portion of the exhaust passageway 130. The components of the exhaust particle detector 200A used to detect particles can be disposed around the central portion 204. For example, the exhaust particle detector 200A can include a first portion $200A_1$ for directing a beam of energy along a path P into and through the interior region 205, a second portion $200A_2$ for absorbing the undisturbed portions of the beam of energy (e.g., portions that are not reflected or substantially diffracted) at the end of the path P, a third portion $200A_3$ for detecting reflections in a first direction (upward in FIG. 2) of the beam of energy off of particles, and a fourth portion $200A_4$ for detecting reflections in a second direction (downward in FIG. 2) of the beam of energy off of particles. In one embodiment, the exhaust particle detector 200A can include flanges (not shown) at either end of the exhaust particle detector 200A in the X-direction to enable mounting to corresponding flanges (not shown) on the piping of the exhaust passageway 130. In one example, the flange may be a KF, CF, ISO or other similar type of flange.

The first portion $200A_1$ of the exhaust particle detector 200A can include an energy source 201 configured to emit a first beam 211. The energy source 201 can be, for example, a collimated, coherent light source (i.e., coherent electromagnetic radiation), such as a laser or laser diode. In some embodiments, the laser can be a red laser or a green laser having a power output from about 20 mW to about 10 W, such as about 200 mW to about 2 W.

The first portion $200A_1$ can further include one or more optical devices configured to direct the first beam 211 along a path P through the interior region 205 of the exhaust particle detector 200A. For example, the first portion $200A_1$ can include optical devices, such as a first cylindrical lens 221, a second cylindrical lens 222, and an aperture 225. The first cylindrical lens 221 can be positioned to receive the first beam 211 and output a second beam 212. The second beam 212 can be a 2-dimensional beam, such as a rectangular beam. The second cylindrical lens 222 can be positioned to receive the second beam 212 from the first cylindrical lens 221 and output a third beam 213. The third beam 213 can be a 2-dimensional beam, such as a rectangular beam, so that a larger portion of the interior region 205 can be analyzed for detection of particles relative to a beam that focuses on a point. In some embodiments, the dimension of the third beam 213 in the Z-direction is longer than the dimension of the second beam 212 in the Z-direction by a multiple of about 2 to about 10, such as by a multiple of about 6.

The aperture 225 can be positioned to receive the third beam 213 from the second cylindrical lens 222. The aperture 225 limits the size of the two dimensional third beam 213 that passes through the aperture 225. In one embodiment, the aperture 225 is an adjustable iris. In some embodiments, the aperture 225 is shorter in the Z-direction than the dimension of the third beam 213 in the Z-direction.

The first portion $200A_1$ can include a first window 231 disposed between the aperture 225 and the interior region 205. The first window 231 allows the energy (e.g., light) from the third beam 213 to pass into the interior region 205 while preventing any gas or particles in the exhaust from entering inside the first portion $200A_1$. The window 231 can be recessed relative to the wall of the central portion to reduce the amount of light from the third beam 213 that could travel directly to the third portion $200A_3$ or fourth portion $200A_4$. Furthermore, the aperture 225 can be shorter in the Z-direction than the dimension of the window 231 in the Z-direction. The window 231 can be a low scatter window, and in some embodiments one or more baffles can be added over one or more surfaces of the window to further limit any scattering of the third beam in the interior region 205 not caused by particles.

The third beam 213 passes through the first window 231 and travels along the path P to the second portion $200A_2$ of the exhaust particle detector 200A. The path P extends through at least a portion of the exhaust passageway 130 to enable detection of particles in the exhaust passageway 130. In the embodiment shown in FIG. 2, the path P extends from one side to an opposing side of the central portion 204 of the exhaust particle detector 200A. The second portion $200A_2$ can be located directly across from the first portion $200A_1$. The second portion $200A_2$ can include a beam dump 280 to absorb the energy of the third beam 213. The beam dump 280 helps to reduce any reflections of the third beam 213 that are not caused by particles.

The third beam 213 may strike a particle 75 while passing through the interior region 205 in a +X or −X direction. The particle 75 may cause reflections of the third beam 213 in numerous directions including directions towards the third portion $200A_3$ and the fourth portion $200A_4$ of the exhaust particle detector 200A. The moving particle 75 can create energy pulses 255 directed towards the third portion $200A_3$ and the fourth portion $200A_4$ as the particle 75 is exhausted through the third beam 213 in the X-direction creating reflections.

The third portion $200A_3$ and the fourth portion $200A_4$ can each include a collection lens 241 and an energy detector 251. The collection lens 241 can be used to focus the energy pulses 255 onto the energy detector 251. The energy detectors 251 of the third portion $200A_3$ and the fourth portion $200A_4$ are disposed at locations other than on the path P, so that the energy detectors 251 only receive energy pulses 255 reflected from the third beam 213.

In some embodiments, the energy detector 251 in the third portion $200A_3$ or the fourth portion $200A_4$ can be a photomultiplier tube. The controller 105 of the system 100 can be used to count energy pulses 255 arriving at the energy detector 251. The controller 105 can record energy pulses 255 detected by the energy detector 251 having a measured amplitude above a first threshold as a detected particle. The first threshold can help to filter out any noise or ambient radiation arriving at the energy detector 251. Energy pulses 255 arriving simultaneously at the same energy detector 251 can be treated as one particle. Furthermore, energy pulses 255 arriving simultaneously at the energy detectors 251 of the portions $200A_3$, $200A_4$ can also be treated as one particle. Having two energy detectors 251 can help reduce the occurrences of false detections of particles by only counting a detected particle when one or more energy pulses is detected at the energy detector 251 of each of the portions $200A_3$, $200A_4$.

When energy pulses 255 are received at the energy detectors 251, the amplitude of the signal supplied by the energy detector 251 can be related to the size of the particle 75 that reflected the energy pulses 255. For example, a large particle can reflect more energy towards the energy detectors 251 than a small particle. The controller 105 can record energy pulses 255 detected by the energy detectors 251 having an amplitude above a second threshold as a detected large particle. The second threshold is greater than the first threshold. For some processes, it may be more important to monitored levels of large particles than overall levels of particles as larger particles can cause more damage to the device being produced on the substrate 50. In some embodiments, more than two thresholds may be used (e.g., 10 thresholds), and a particle size distribution can be developed from the energy pulses 255 received at the energy detectors 251.

The controller 105 can use the first threshold and the second threshold to count the numbers of detected particles and detected large particles over a first time period. The controller 105 can calculate a particle rate in the exhaust from the detected particle count and the first time period. Similarly, the controller 105 can calculate a large particle rate in the exhaust from the detected large particle count and the first time period. The controller 105 can identify a condition (e.g., a fault) based on the calculated particle rate and/or the calculated large particle rate. The identified condition can be used to alert an operator, or enable the controller 105 to take some automatic action in response to the identified condition. For example, in some embodiments when a high particle rate and/or a high large particle rate is detected, the controller 105 can determine not to process another substrate in the process chamber 101 after the present substrate 50 is finished being processed in the process chamber 101. After the present substrate 50 is removed from the process chamber, the controller 105 may further initiate a cleaning operation within in the process chamber 101. Furthermore, the controller 105 may continue to count detected particles during the cleaning operation and continue the cleaning operation until detected particle rates and/or large particle rates drop below specified thresholds.

Figure 3:
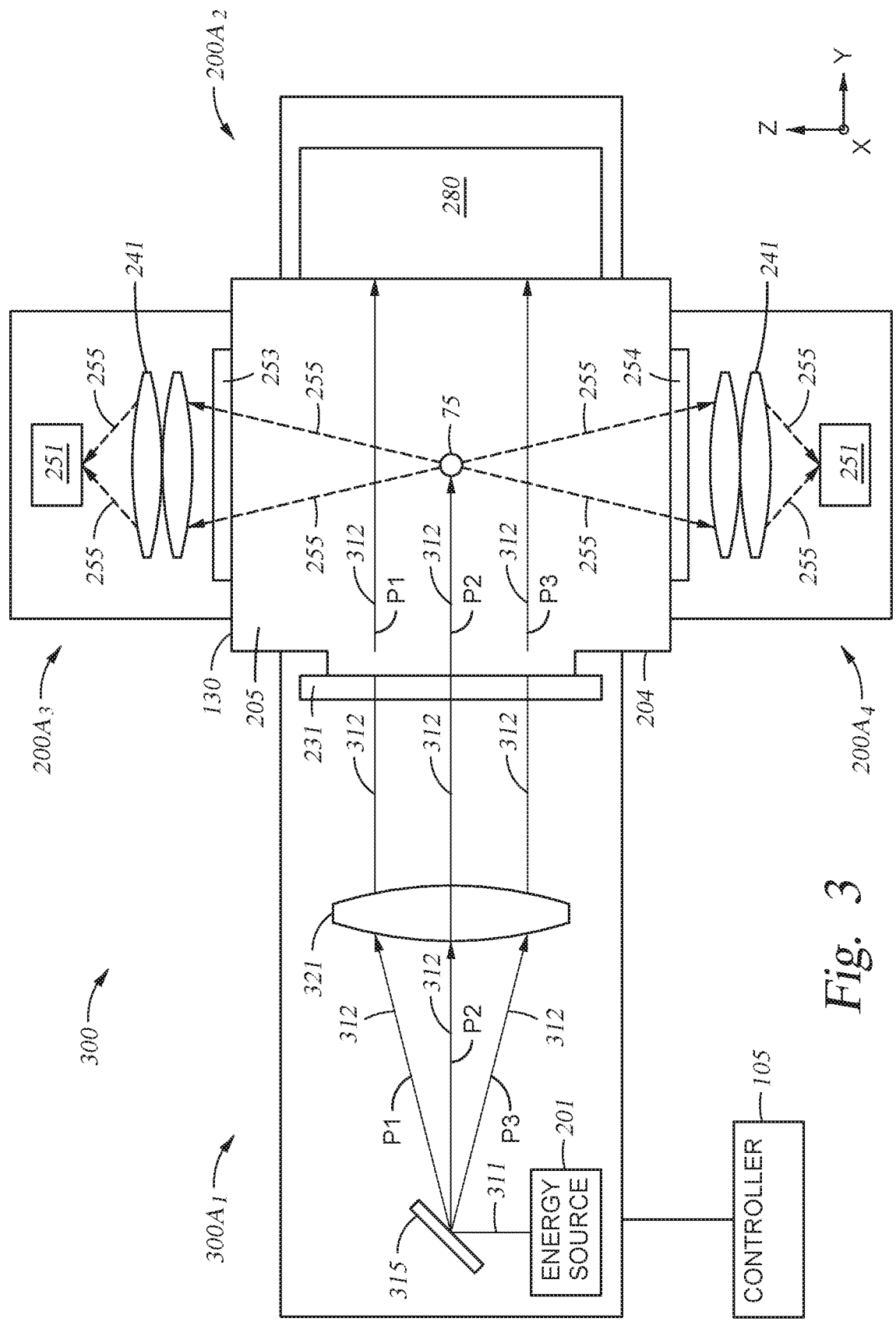
FIG. 3 is a side sectional view of a particle detector disposed around an exhaust passageway, according to another embodiment.

FIG. 3 is a side sectional view of a particle detector 300A disposed around the exhaust passageway 130, according to one embodiment. The particle detector 300A is similar to the particle detector 200A described above except that the particle detector 300A includes a first portion 300A₁ that is different from the first portion 200A₁ of the particle detector 200A. While the first portion 200A₁ of the particle detector 200A directed the third beam 213 having a two dimensional shape of a sheet through the exhaust passageway 130, the first portion 300A₁ of the particle detector 300A directs a narrower beam 312 through the exhaust passageway 130. Like the particle detector 200A, the particle detector 300A may be used in either the exhaust passageway 130 or the inlet passageway 150 of the system 100.

The first portion 300A₁ can include the energy source 201 described above. However in some embodiments, a different energy source may be used. Here, the energy source 201 is configured to emit a first beam 311. The first portion 300A₁ can further include one or more optical devices configured to direct the first beam 311 along one or more paths (shown here as paths P1-P3) through the interior region 205 of the exhaust particle detector 300A. For example, the first portion 300A₁ can include optical devices, such as a scanner 315 and a first lens 321. The scanner 315 can be positioned to receive the first beam 311 and output a second beam 312. The scanner 315 can be adjustable to change the direction of the second beam 312, so that the second beam 312 travels along different paths through the exhaust passageway 130. In one embodiment, the scanner 315 is a scanning galvanometer that is able to be articulated about the X axis and deliver a ribbon shaped beam across the X-Z plane. The first lens 321 can be positioned to receive the second beam 312 and direct the second beam 312 through the window 231 through the exhaust passageway 130 to the beam dump 280. In one embodiment, the first lens 321 can be a f-theta lens.

FIG. 3 shows three separate second beams 312 being directed through the exhaust passageway 130 along paths P1-P3. The three separate second beams 312 represent examples of how the scanner 315 can be adjusted to direct the second beam 312 along different paths. By using the scanner 315 to direct the second beams 312 along the different paths P1-P3, a larger cross-section of the exhaust passageway 130 can be monitored for particle detection. By monitoring this larger cross-section exhaust passageway 130, more accurate particle rate data can be obtained.

The second beam 312 directed along the second path P2 is shown being incident upon the particle 75, which generates energy pulses 255 directed towards the third portion 200A₃ and fourth portion 200A₄. The energy detectors 251 in the third portion 200A₃ and fourth portion 200A₄ and the controller 105 can be used as described above in reference to FIG. 2 to determine particle rates, large particle rates, and particle size distributions. Furthermore, the controller 105 can similarly be used as described above to identify conditions, such as faults, and respond accordingly, such as suspending the processing of additional substrates after high particle rates are detected.

Figure 4:
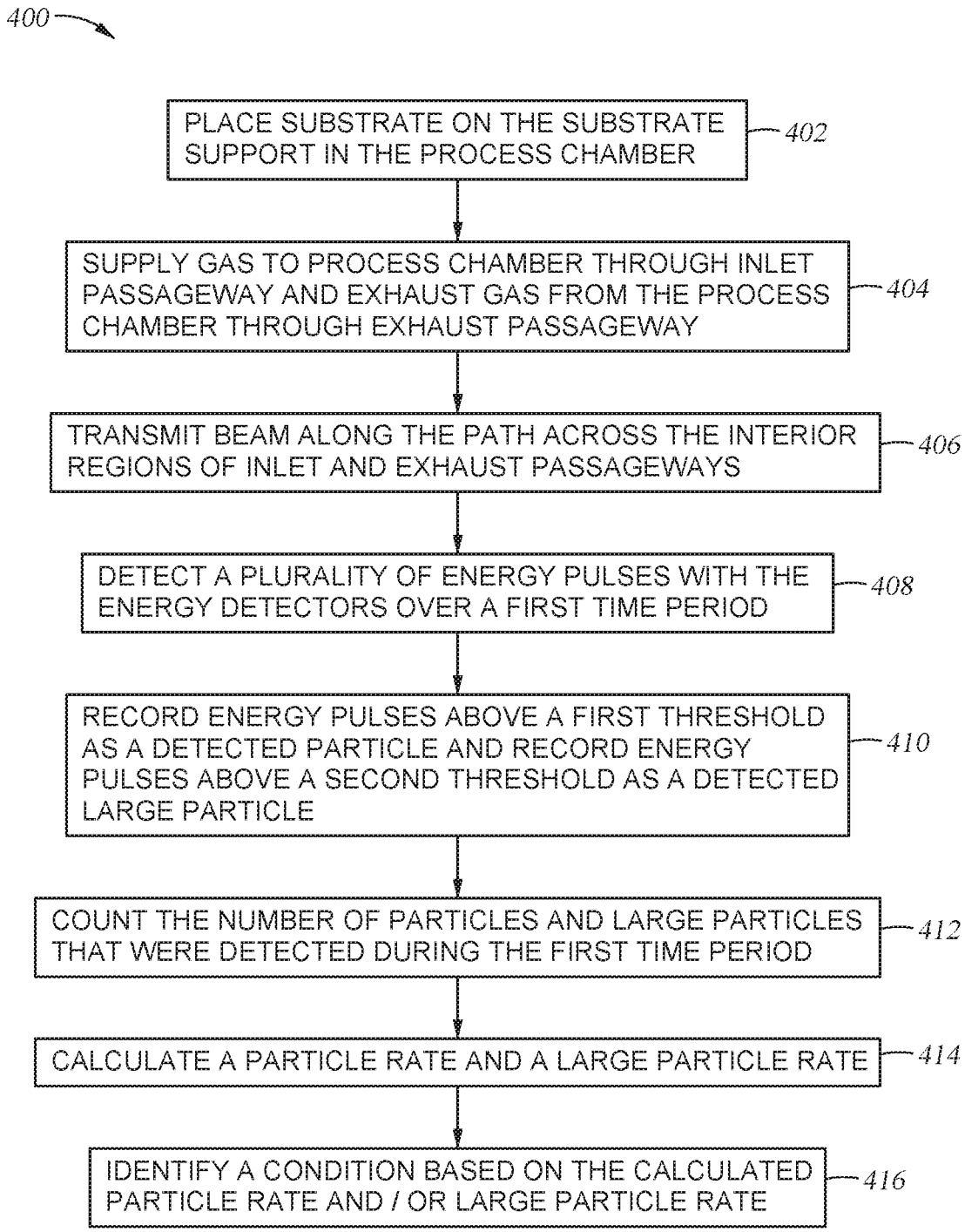
FIG. 4 illustrates a process flow diagram of a method for monitoring a system used for processing substrates in a process chamber, according to one embodiment.

FIG. 4 illustrates a process flow diagram of a method 400 for monitoring the system 100 used for processing substrates 50 in the process chamber 101, according to one embodiment. Referring to FIGS. 1, 2, and 4, the method 400 is described. At block 402, the substrate 50 is placed on the substrate support 110 in the process chamber 101. At block 404, the system 100 begins supplying process gas to the interior region 104 of the process chamber 101 through the inlet passageway 150 and exhausting gas from the process chamber 101 through the exhaust passageway 130.

At block 406, the particle detectors 200A, 200B can begin transmitting the first beam 211 along the path P across the interior regions 205 of the exhaust passageway 130 and the inlet passageway 150 respectively. At block 408, the energy detectors 251 in each particle detector 200A, 2200B can detect a plurality of energy pulses 255 over a first time period. These energy pulses 255 can be caused by reflections of the third beam 213 from particles 75 passing through the second beams 212. At block 410, the controller 105 can record energy pulses 255 above a first threshold as a detected particle, and record energy pulses 255 above a second threshold as a detected large particle. At block 412, the controller can count the number of particles and large particles that were detected during the first time period for each particle detector 200A, 2200B.

At block 414, the controller 105 can calculate a particle rate and a large particle rate in the passageways 130, 150 from the count of the detected particles and detected large particles over the first time period. At block 416, the controller 105 can identify a condition, such as a fault, based on the calculated particle rate and/or large particle rate when these rates are above or below a specified threshold. For some conditions, the controller 105 can take appropriate action based on the identified condition, such as suspending the processing of additional wafers after a high particle rate and/or a high large particle rate is calculated. In some embodiments, the controller 105 can also initiate a cleaning process in one or more parts of the processing chamber based on a comparison of the measured particle rates and a particle fault limit value stored in the memory of the controller 105. In one example, the controller 105 may cause a cleaning gas (e.g., halogen containing gas, an inert gas, activated halogen containing gas, etc.) to be supplied to the interior region 104 of the process chamber or a portion of one or more of the passageways 130, 150 to remove the source of the particles and/or reduce the particle levels in these regions of the chamber when a measured particle rate exceeds a particle fault limit value (e.g., 1 particle per cubic meter (particle/m³) of gas of >0.1 μm in size).

Figure 5:
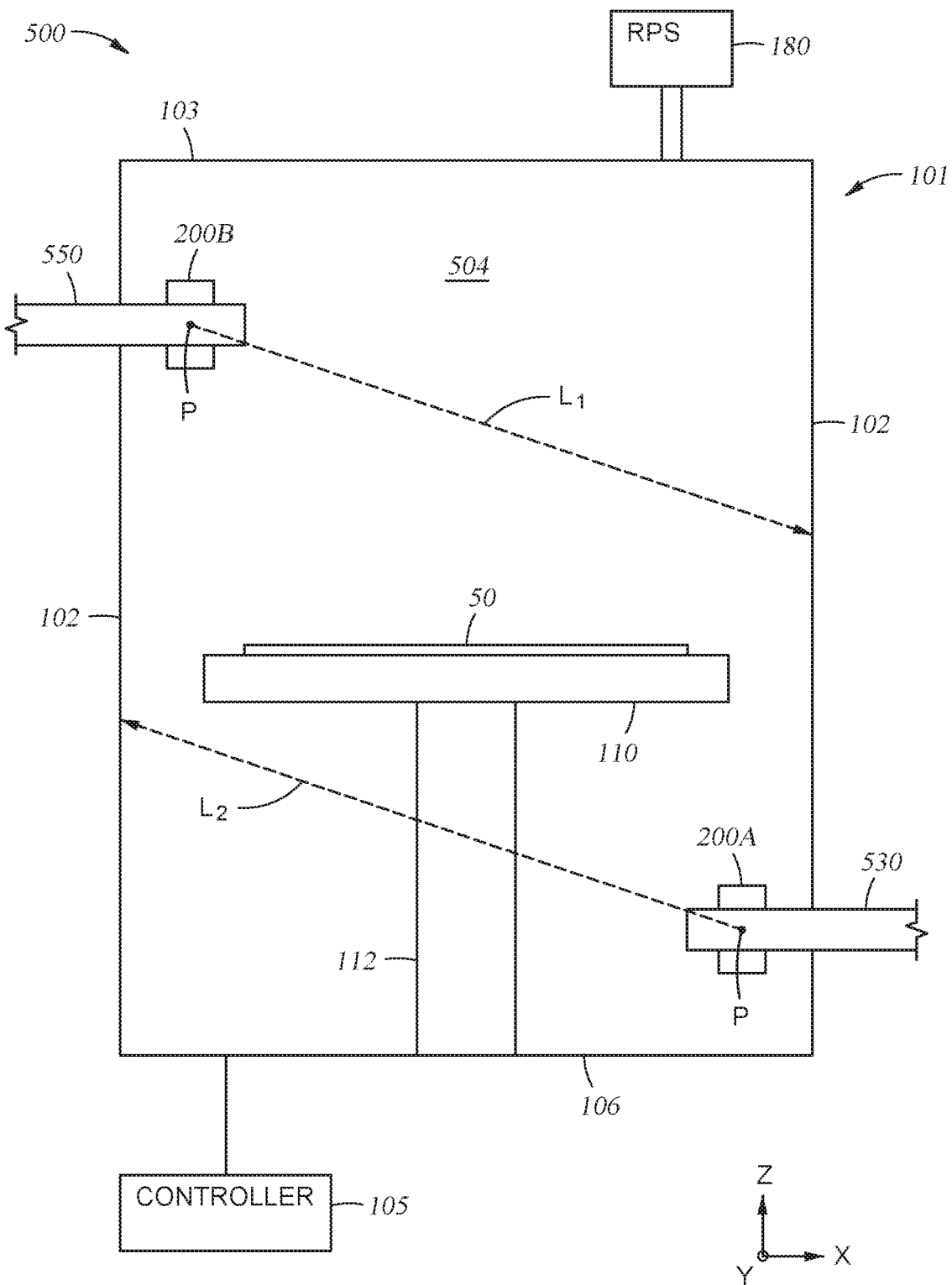
FIG. 5 is a side view of a system for processing a substrate, according to another embodiment.

FIG. 5 is a side view of a system 500 for processing a substrate 50, according to another embodiment. The system 500 is the same as the system 100 described above except that the particle detectors 200A, 200B are disposed inside the process chamber 101 and the gas passageways 130, 150 are replaced with respective gas passageways 530, 550. In the system 500, the inlet passageway 550 extends through one of the sidewalls 102 of the process chamber 101 instead of entering through the top 103 of the process chamber 101. The inlet particle detector 200B is disposed above the substrate support 110 when the substrate support 110 is in the position used for processing the substrate 50. Furthermore, the exhaust particle detector is disposed below the substrate support 110 when the substrate support 110 is in the position used for processing the substrate 50.

Placing the particle detectors 200A, 200B inside of the process chamber 101 places the particle detectors 200A, 200B closer to the substrate 50 being processed allowing for the particle detectors 200A, 200B to monitor particle rates in an environment that is closer to the environment to which the substrate 50 is exposed relative to particle detectors disposed outside of the process chamber 101. The particle detectors 200A, 200B can each direct a beam along a path P in the Y-direction across the inlet passageway 550. FIG. 5 illustrates a line L1 to demonstrate that the substrate support 110 is not within a line of sight of the path P of the particle detector 200B. Similarly, FIG. 5 illustrates a line L2 to demonstrate that the substrate support 110 is not within a line of sight of the path P of the particle detector 200A. Having the substrate support 110 positioned to not be within the line of sight of the path P of the respective laser beams of the particle detectors 200A, 200B can reduce any interference to the process being performed on the substrate 50 caused by the reflections of the respective laser beams of the particle detectors 200A, 200B.

While the foregoing is directed to embodiments of the present disclosure, other and further embodiments of the disclosure may be devised without departing from the basic scope thereof, and the scope thereof is determined by the claims that follow.

The invention claimed is:

1. A system for processing a substrate comprising:
 a process chamber comprising:
  one or more sidewalls enclosing an interior region; and
  a substrate support in the interior region;
 a first passageway disposed outside of the process chamber and connected to the process chamber, the first passageway configured to exhaust gas from the interior region of the process chamber or supply gas to the interior region of the process chamber; and
 a first particle detector disposed at a first location along the first passageway, wherein the first particle detector comprises:
  an energy source configured to emit a first beam;
  one or more optical devices configured to direct the first beam along one or more paths, wherein the one or more paths extend through at least a portion of the first passageway; and
  a first energy detector disposed at a location other than on the one or more paths; and
 a controller configured to communicate with the first particle detector, wherein the controller is configured to identify a fault based on signals received from the first energy detector of the first particle detector.

2. The system of claim 1, wherein the first particle detector further comprises a second energy detector disposed at a location other than on the one or more paths.

3. The system of claim 1, wherein
 the one or more paths includes a plurality of paths; and
 the one or more optical devices comprises a scanner that is adjustable to direct the first beam along different paths of the plurality of paths.

4. The system of claim 1, wherein the one or more optical devices comprises an aperture.

5. The system of claim 1, wherein the first particle detector and the controller are configured to collectively:
 record energy pulses detected by the first energy detector having an amplitude above a first threshold as a detected particle;
 perform a first count of a number of detected particles over a first time period;
 calculate a particle rate in the first passageway from the first count and the first time period; and
 identify the fault based on calculated particle rate.

6. The system of claim 1, wherein the first particle detector and the controller are configured to collectively:
 record energy pulses detected by the first energy detector having an amplitude above a first threshold as a detected particle;
 perform a first count of a number of detected particles over a first time period;
 calculate a particle rate in the first passageway from the first count and the first time period;
 record energy pulses detected by the first energy detector having an amplitude above a second threshold as a detected large particle, wherein the second threshold is greater than the first threshold;
 perform a second count of a number of detected large particles over the first time period;
 calculate a large particle rate in the first passageway from the second count and the first time period; and
 identify the fault based on calculated particle rate and the calculated large particle rate.

7. The system of claim 1, wherein the first energy detector is a photomultiplier tube.

8. The system of claim 1, wherein the first particle detector is configured to detect airborne particles.

9. The system of claim 1, wherein the first particle detector includes a beam dump and the one or more paths begin at the energy source and end at the beam dump.

10. A method of monitoring a system for processing substrates in a process chamber, the method comprising:
 placing a substrate in the process chamber;
 exhausting gas from the process chamber or supplying gas to the process chamber through a first passageway that is disposed outside of the process chamber;
 transmitting a first beam along a first path across a first region of the first passageway;
 detecting a first plurality of pulses of energy from the first beam at a first energy detector, wherein the first energy detector is disposed at a location other than on the first path; and
 identifying a fault based on the detected first plurality of pulses.

11. The method of claim 10, further comprising:
 recording a second plurality of energy pulses detected by the first energy detector as a detected particle, wherein each pulse in the second plurality of pulses has an amplitude above a first threshold;
 performing a first count of a number of detected particles over a first time period;
 calculating a particle rate in the first passageway from the first count and the first time period; and
 identifying the fault based on the calculated particle rate.

12. The method of claim 11, further comprising:
 recording energy pulses detected by the first energy detector above a second threshold as a detected large particle, wherein the second threshold is greater than the first threshold;
 performing a second count of a number of detected large particles over the first time period;
 calculating a large particle rate in the first passageway from the second count and the first time period; and
 identifying the fault based on the calculated large particle rate.

13. The method of claim 11, further comprising directing the first beam along different paths in the first passageway during the first time period.

14. The method of claim 10, wherein the first beam is directed through a cylindrical lens.

15. The method of claim 10, wherein the first plurality of pulses of energy are detected in response to the first beam being reflected from an airborne particle.

16. The method of claim 10, further comprising performing a deposition process, an etching process, an implantation process, or a lithography process on the substrate when the first beam is transmitted.

17. A system for processing a substrate comprising:
 a process chamber comprising:
  one or more sidewalls enclosing an interior region; and
  a substrate support;

a first particle detector disposed in the process chamber, wherein the first particle detector comprises:
an energy source configured to emit a first beam;
a beam dump;
one or more optical devices configured to direct the first beam along one or more paths, wherein the one or more paths begin at the energy source and end at the beam dump; and
a first energy detector disposed at a location other than on the one or more paths; and
a controller configured to communicate with the first particle detector, wherein the controller is configured to identify a fault based on signals received from the first energy detector of the first particle detector.

18. The system of claim 17, wherein the first particle detector and the controller are configured to collectively:
record energy pulses detected by the first energy detector having an amplitude above a first threshold as a detected particle;
perform a first count of a number of detected particles over a first time period;
calculate a particle rate in the first particle detector from the first count and the first time period; and
identify the fault based on calculated particle rate.

19. The system of claim 17, wherein the substrate support is not within line of sight of the one or more paths of the first beam of the first particle detector.

20. The system of claim 17, further comprising a second particle detector disposed in the process chamber, wherein the first particle detector is positioned below the substrate support and the second particle detector is positioned above the substrate support.

* * * * *